United States Patent
Tan et al.

(10) Patent No.: US 11,099,629 B2
(45) Date of Patent: Aug. 24, 2021

(54) DEVICE-DEPENDENT PEAK POWER THROTTLING FOR BATTERY-OPERATED SYSTEMS

(71) Applicant: DELL PRODUCTS, LP, Round Rock, TX (US)

(72) Inventors: Geroncio O. Tan, Austin, TX (US); Merle J. Wood, III, Round Rock, TX (US); Marcin M. Nowak, Round Rock, TX (US); Wei-Cheng (Jason) Yu, Taipei Tucheng (TW); Tsung-Cheng (Anson) Liao, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 84 days.

(21) Appl. No.: 16/596,052

(22) Filed: Oct. 8, 2019

(65) Prior Publication Data
US 2021/0103330 A1  Apr. 8, 2021

(51) Int. Cl.
G06F 1/00     (2006.01)
G06F 1/3296   (2019.01)
G01R 19/14    (2006.01)
G06F 1/26     (2006.01)

(52) U.S. Cl.
CPC ........... *G06F 1/3296* (2013.01); *G01R 19/14* (2013.01); *G06F 1/263* (2013.01); *G06F 1/266* (2013.01)

(58) Field of Classification Search
CPC .................................................... G06F 1/3296
See application file for complete search history.

(56) References Cited

U.S. PATENT DOCUMENTS

| | | | |
|---|---|---|---|
| 8,683,090 B2* | 3/2014 | Mullins | G01R 19/0084 710/16 |
| 9,231,409 B2 | 1/2016 | Bilhan | |
| 2011/0010566 A1 | 1/2011 | Bandholz et al. | |
| 2013/0305066 A1* | 11/2013 | Mullins | H02J 7/0021 713/310 |
| 2015/0296585 A1* | 10/2015 | Nieberlein | H05B 47/10 315/201 |
| 2017/0054310 A1* | 2/2017 | Chen | H02J 7/04 |
| 2018/0074564 A1* | 3/2018 | Paparrizos | H02M 7/04 |
| 2018/0284879 A1 | 10/2018 | Gorbatov et al. | |
| 2019/0044322 A1* | 2/2019 | Hijazi | H02H 7/20 |
| 2019/0086994 A1* | 3/2019 | Regupathy | G06F 1/266 |
| 2019/0117139 A1 | 4/2019 | Al-Ali et al. | |
| 2019/0254131 A1* | 8/2019 | Bretzer | H05B 45/37 |

* cited by examiner

*Primary Examiner* — Mohammed H Rehman
(74) *Attorney, Agent, or Firm* — Larson Newman, LLP

(57) ABSTRACT

An information handling system (IHS) includes a source load switch connected to a power management circuit, and a port for connection of a device. The IHS detects attachment of the device to the port, and determines whether the device is a current sink. When the device is a current sink, the IHS sets the peak processor power level to a reduced level, determines detachment of the device, and in response to determining detachment of the device, restores a maximum peak processor power level. When the device is not a current sink, the HIS starts charging, sets a dynamic peak processor power level to an AC+DC setting, determines detachment of the device, and in response to determining detachment of the device, sets the peak processor power level to a DC-only setting.

20 Claims, 3 Drawing Sheets

DEVICE-DEPENDENT PEAK POWER THROTTLING FOR BATTERY-OPERATED SYSTEMS

FIELD OF THE DISCLOSURE

The present disclosure generally relates to information handling systems, and more particularly relates to device-dependent peak power throttling for battery-operated systems.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system (IHS) may include a source load switch connected to a power management circuit, and a port for connection of a device. The IHS detects attachment of the device to the port, and determines whether the device is a current sink. When the device is a current sink, the IHS sets the peak processor power level to a reduced level, determines detachment of the device, and in response to determining detachment of the device, restores a maximum peak processor power level. When the device is not a current sink, the HIS starts charging, sets a dynamic peak processor power level to an AC+DC setting, determines detachment of the device, and in response to determining detachment of the device, sets the peak processor power level to a DC-only setting.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
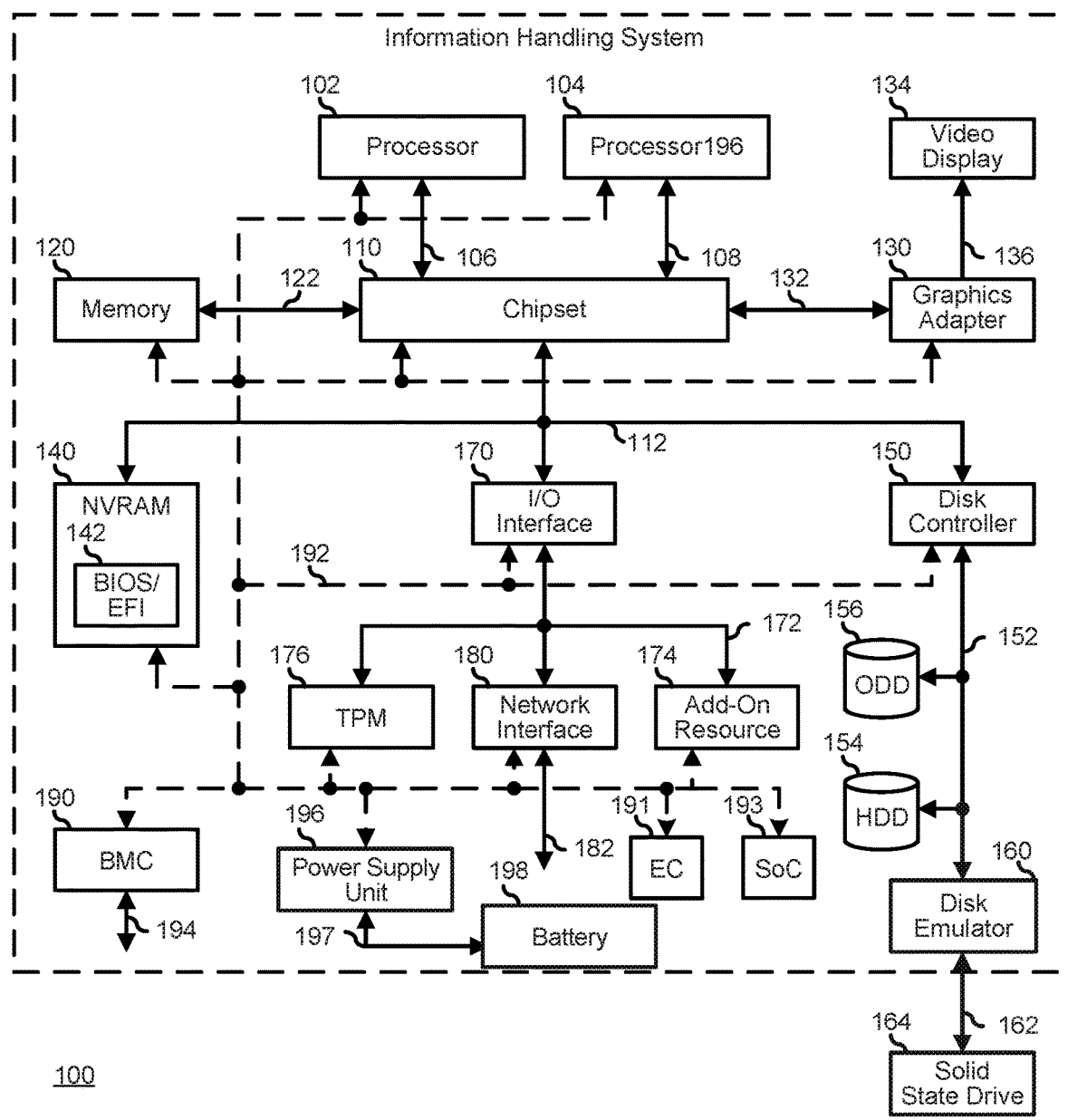
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a system-on-a-chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, a nonvolatile random access memory (NVRAM) module 140, a disk controller 150, a disk emulator 160, an input/output (I/O) interface 170, a network interface 180, a trusted platform module (TPM) 176, a baseboard management controller (BMC) 190, and enclosure controller (EC) 191, and a system-on-a-chip (SoC) 193. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

NVRAM module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. NVRAM module 140 comprises a basic input and output system/extensible firmware interface (BIOS/EFI) module 142. BIOS/EFI module 142 includes BIOS/EFI code operable to detect resources within information handling system 100, to provide drivers for the resources, initialize the resources, and access the resources. BIOS/EFI module 142 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174, to network interface 180, and to TPM 176. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channel 182 that provides interfaces to devices that are external to information handling system 100. In a particular embodiment, network channel 182 is of a different type than peripheral channel 172 and network interface 180 translates information from a format suitable to the peripheral channel to a format suitable to external devices. An example of network channel 182 includes InfiniBand channels, Fibre Channel channels, Gigabit Ethernet channels, proprietary channel architectures, or a combination thereof. Network channel 182 can be connected to external network resources (not illustrated). The network resource can include another information handling system, a data storage system, another network, a grid management system, another suitable resource, or a combination thereof.

BMC 190 is connected to IHS components such as processor 102, processor 104, memory 120, chipset 110, graphics adapter 130, NVRAM module 140, I/O interface 170, disk controller 150, TPM 176, network interface 180, add-on resource 174, EC 191, and SoC 193 via management interface 192. BMC 190 is connected to an external management interface 194 for platform management by an external IHS.

IHS 100 includes power supply unit (PSU) 196, battery connection 197, and battery 198. Battery 198 is connected to PSU 196 via battery connection 197. PSU 196 provides power to system components of IHS 100.

In accordance with at least one embodiment, device-dependent peak power throttling is provided for battery-operated systems. Peak power, such as what is termed power level 4 (PL4), of a typical system-on-a-chip (SoC) continues to increase significantly from one generation to the next generation, for example, by a factor of three in at least one case. Such increases pose a significant challenge to voltage regulator (VR) design, layout, thermal considerations, and battery design. Such difficulties are exacerbated when the system with multiple ports also has to source power to connected devices. In many cases, power demands of connected devices can be over 30 watts (W), exceeding the battery peak power capabilities and possibly turning off the system (for example battery overcurrent protection may be triggered or power management integrated circuit (PMIC) under-voltage lockout can occur).

To attempt to mitigate this issue, the power delivery (PD) controller can notify the enclosure controller (EC) and dynamic platform thermal framework (DPTF) to adjust the SoC peak power limit when a universal serial bus type C (USB-C) connector becomes a source port (for example supplying 15 W to a far-end docked device or 4.5 W to a universal serial bus (USB) 3.0 device). However, while such a solution may have addressed the peak power concern, it penalized the system performance as a processor hot (PROCHOT#) signal, which indicates activation of a thermal control circuit of a processor, will cause the SoC to throttle to low frequency mode (LFM) immediately, impacting central processing unit (CPU) peak performance momentarily (until the CPU can recover from LFM). Thus, a novel approach, which can be termed Soft PROCHOT#, is provided. Soft PROCHOT# can be implemented according to an enclosure controller (EC) method or a system-on-a-chip (SoC) method.

Figure 2:
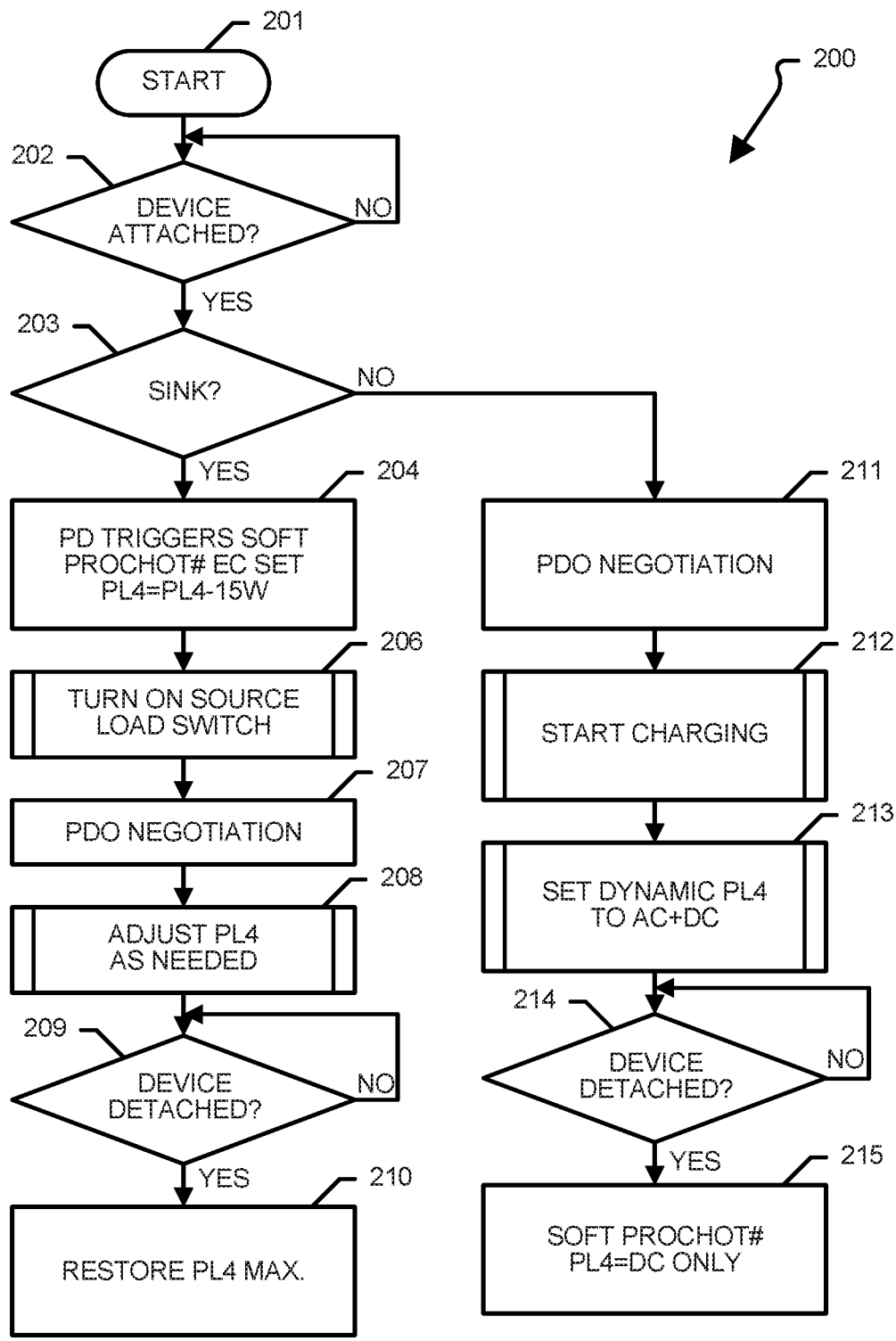
FIG. 2 is a flow diagram illustrating an enclosure controller (EC) method of device-dependent peak power throttling for battery-operated systems in accordance with at least one embodiment.

FIG. 2 shows an enclosure controller (EC) method of device-dependent peak power throttling for battery-operated systems in accordance with at least one embodiment. Method 200 begins at block 201 and continues to decision block 202. At decision block 202, a decision is made as to whether or not a device is attached. If not, method 200 returns to decision block 202. If so, method 200 continues to decision block 203. At decision block 203, a decision is made as to whether or not the attached device is a current sink. If so, method 200 continues to block 204. At block 204, a power delivery (PD) circuit triggers a Soft PROCHOT# signal (not the actual hardware PROCHOT# signal), and the EC sets the peak processor power level (for example PL4) to the peak processor power level minus an amount of power (for example 15 W). From block 204, method 200 continues to block 206. At block 206, a source load switch is turned on. From block 206, method 200 continues to block 207. At block 207, PDO negotiation is performed. From block 207, method 200 continues to block 208. At block 208, the peak processor power level is adjusted as needed. From block 208, method 200 continues at decision block 209. At decision block 209, a decision is made as to whether or not the device has been detached. If not, method 200 returns to decision block 209. If so, method 200 continues to block 210. At block 210, a maximum peak processor power level is restored.

If, at decision block 203, a decision was made that the attached device is not a current sink, method 200 continues at block 211. At block 211, PDO negotiation is performed. From block 211, method 200 continues at block 212. At block 212, charging is started. From block 212, method 200 continues to block 213. At block 213, a dynamic peak processor power level is set to AC+DC. From block 213, method 200 continues to decision block 214. At decision block 214, a decision is made as to whether or not the device has been detached. If not, method 200 returns to decision block 214. If so, method 200 continues to block 215. At block 215, a Soft PROCHOT# signal (not the actual hardware PROCHOT# signal) is asserted, and the peak processor power level is set to DC only.

Rather than asserting an ALERT # signal or a PROCHOT# signal, which cause the SoC to throttle to LFM immediately, the EC determines the maximum load allocated for the port that the device is plugged in and adjust the peak power limit of the system before enabling the source path to the device. The EC may further interrogate and negotiate power-data objects (PDO) with the device and give back peak power allocation to the system if it determined that the device does not need the maximum allocated power (for example if port is allocated 15 W to support a docked device via a docking interface but the device is only asking for 5 W, 10 W can be allocated back to the system).

Figure 3:
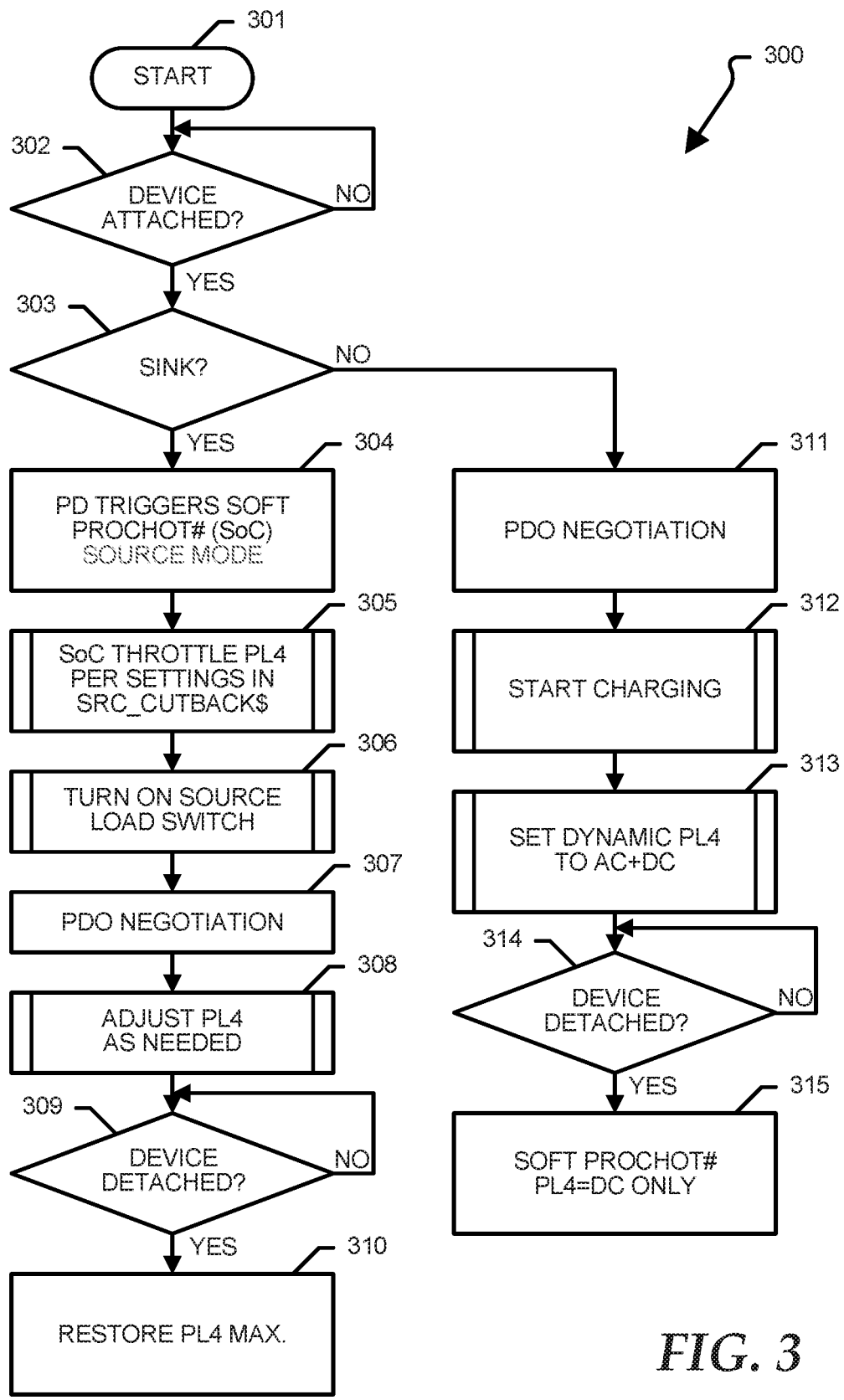
FIG. 3 is a flow diagram illustrating a system-on-a-chip (SoC) method of device-dependent peak power throttling for battery-operated systems in accordance with at least one embodiment.

FIG. 3 shows a system-on-a-chip (SoC) method of device-dependent peak power throttling for battery-operated systems in accordance with at least one embodiment. Method 300 begins at block 301 and continues to decision block 302. At decision block 302, a decision is made as to whether or not a device is attached. If not, method 300 returns to decision block 302. If so, method 300 continues to decision block 303. At decision block 303, a decision is made as to whether or not the attached device is a current sink. If so, method 300 continues to block 304. At block 304, a power delivery (PD) circuit triggers a Soft PROCHOT# (SoC) source mode. From block 304, method 300 continues to block 305. At block 305, the SoC throttles the peak processor power level per settings in a SRC_CUTBACK$ register, which may, for example, be a register in the SoC. From block 305, method 300 continues to block 306. At block 306, a source load switch is turned on. From block 306, method 300 continues to block 307. At block 307, PDO negotiation is performed. From block 307, method 300 continues to block 308. At block 308, the peak processor power level is adjusted as needed. From block 308, method 300 continues at decision block 309. At decision block 309, a decision is made as to whether or not the device has been detached. If not, method 300 returns to decision block 309. If so, method 300 continues to block 310. At block 310, a maximum peak processor power level is restored.

If, at decision block 303, a decision was made that the attached device is not a current sink, method 300 continues at block 311. At block 311, PDO negotiation is performed. From block 311, method 300 continues at block 312. At block 312, charging is started. From block 312, method 300 continues to block 313. At block 313, a dynamic peak processor power level is set to AC+DC. From block 313, method 300 continues to decision block 314. At decision block 314, a decision is made as to whether or not the device has been detached. If not, method 300 returns to decision block 314. If so, method 300 continues to block 315. At block 315, a Soft PROCHOT# signal (not the actual hardware PROCHOT# signal) is asserted, and the peak processor power level is set to DC only.

A SoC can be designed to have a secondary PROCHOT# logic (PROCHOT2 #). The CPU will throttle down to a pre-programmed level in the SoC register (i.e. SRC_CUTBACK for source mode) when PROCHOT2 # is triggered. For example, when a device is plug into a docking cable port, the pre-programmed level can be set to 15 W and the CPU will throttle down by 15 W when PROCHOT2 # is triggered. Once the EC confirm the downstream device does not need the full 15 W it can reset the PL4 limit to a higher level.

Embodiments can be beneficially employed, for example, with any systems with a SoC with high peak processor power levels and multiple downstream ports. In accordance with at least one embodiment, the system peak power capabilities can be kept within design parameters while not taxing the CPU performance, such as would occur with the typical assertion of the PROCHOT# signal. In accordance with at least one embodiment, scalable peak power reduction based on demand can be provided.

In accordance with at least one embodiment, an information handling system (IHS) includes a battery; a power management circuit connected to the battery; a source load switch connected to the power management circuit; and a port for connection of a device, wherein the IHS detects attachment of a device to the port; determines whether the device is a current sink; when the device is a current sink, sets the peak processor power level to a reduced level, determines detachment of the device, and, in response to determining detachment of the device, restores a maximum peak processor power level; and, when the device is not a current sink, starts charging, sets a dynamic peak processor power level to an AC+DC setting, determines detachment of the device, and, in response to determining detachment of the device, sets the peak processor power level to a DC-only setting.

In accordance with at least one embodiment, the IHS sets the peak processor power level to a reduced level by setting, by an enclosure controller (EC), the peak processor power level to the peak processor power level minus an amount of power. In accordance with at least one embodiment, the IHS sets the peak processor power level to a reduced level by triggering, by a power delivery (PD) circuit, a Soft PROCHOT# source mode and throttling, by a system-on-a-chip (SoC), the peak processor power level per settings in a SRC_CUTBACK$ register. In accordance with at least one embodiment, when the device is a current sink, the IHS turns on a source load switch. In accordance with at least one embodiment, the IHS performs power-data objects (PDO) negotiation. In accordance with at least one embodiment, when the device is a current sink, the IHS adjusts the peak processor power level as needed. In accordance with at least one embodiment, the IHS inhibits immediate assertion of a native hardware processor-hot (PROCHOT#) signal.

In accordance with at least one embodiment, a method includes detecting attachment of a device; determining whether the device is a current sink; when the device is a current sink, performing the following: setting, by an enclosure controller (EC), the peak processor power level to the peak processor power level minus an amount of power; determining detachment of the device; and in response to determining detachment of the device, restoring a maximum peak processor power level; and, when the device is not a current sink, performing the following: starting charging; setting a dynamic peak processor power level to an AC+DC setting; determining detachment of the device; and, in response to determining detachment of the device, setting the peak processor power level to a DC-only setting.

In accordance with at least one embodiment, the method further includes, when the device is a current sink, turning on a source load switch. In accordance with at least one embodiment, the method further includes performing power-data objects (PDO) negotiation. In accordance with at least one embodiment, the method further includes, when the device is a current sink, adjusting the peak processor power level as needed. In accordance with at least one embodiment, the method is implemented in a battery-operated system. In accordance with at least one embodiment, the method further includes inhibiting immediate assertion of a native hardware processor-hot (PROCHOT#) signal.

In accordance with at least one embodiment, a method includes detecting attachment of a device; determining whether the device is a current sink; when the device is a current sink, performing the following: triggering, by a power delivery (PD) circuit, a Soft PROCHOT# source mode; throttling, by a system-on-a-chip (SoC), the peak processor power level per settings in a SRC_CUTBACK$ register; determining detachment of the device; and, in response to determining detachment of the device, restoring a maximum peak processor power level; and, when the device is not a current sink, performing the following: starting charging; setting a dynamic peak processor power level to an AC+DC setting; determining detachment of the device; and, in response to determining detachment of the device, setting the peak processor power level to a DC-only setting.

In accordance with at least one embodiment, the method further includes, when the device is a current sink, turning on a source load switch. In accordance with at least one embodiment, the method further includes performing power-data objects (PDO) negotiation. In accordance with at least one embodiment, the method further includes, when the device is a current sink, adjusting the peak processor power level as needed. In accordance with at least one embodiment, the method is implemented in a battery-operated system. In accordance with at least one embodiment, the SoC includes a secondary processor-hot circuit (PROCHOT2 #). In accordance with at least one embodiment, the method further includes inhibiting immediate assertion of a native hardware processor-hot (PROCHOT#) signal.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system (IHS) comprising:
a battery;
a power management circuit connected to the battery;
a source load switch connected to the power management circuit; and
a port for connection of a device, wherein the IHS detects attachment of the device to the port; determines whether the device is a current sink; when the device is a current sink, sets a peak processor power level to a reduced level, determines detachment of the device, and in response to determining detachment of the device, restores a maximum peak processor power level; and, when the device is not a current sink, starts charging, sets a dynamic peak processor power level to an AC+DC setting, determines detachment of the device, and in response to determining detachment of the device, sets the peak processor power level to a DC-only setting.

2. The IHS of claim 1, wherein the IHS sets the peak processor power level to a reduced level by setting, by an enclosure controller (EC), the peak processor power level to the peak processor power level minus an amount of power.

3. The IHS of claim 1, wherein the IHS sets the peak processor power level to a reduced level by triggering, by a power delivery (PD) circuit, a Soft PROCHOT# source mode and throttling, by a system-on-a-chip (SoC), the peak processor power level per settings in a register of the SoC.

4. The IHS of claim 1, wherein, when the device is a current sink, the IHS turns on a source load switch.

5. The IHS of claim 1, wherein the IHS performs power-data objects (PDO) negotiation.

6. The IHS of claim 1, wherein, when the device is a current sink, the IHS adjusts the peak processor power level as needed.

7. The IHS of claim 1, wherein the IHS inhibits immediate assertion of a native hardware processor-hot (PROCHOT#) signal.

8. A method comprising:
detecting attachment of a device;
determining whether the device is a current sink;
when the device is a current sink:
  setting, by an enclosure controller (EC), a peak processor power level to the peak processor power level minus an amount of power;
  determining detachment of the device; and
  in response to determining detachment of the device, restoring a maximum peak processor power level; and
when the device is not a current sink:
  starting charging;
  setting a dynamic peak processor power level to an AC+DC setting;
  determining detachment of the device; and
  in response to determining detachment of the device, setting the peak processor power level to a DC-only setting.

9. The method of claim 8, further comprising:
when the device is a current sink, turning on a source load switch.

10. The method of claim 8, further comprising:
performing power-data objects (PDO) negotiation.

11. The method of claim 8, further comprising:
when the device is a current sink, adjusting the peak processor power level as needed.

12. The method of claim 8, wherein the method is implemented in a battery-operated system.

13. The method of claim 8 further comprising:
inhibiting immediate assertion of a native hardware processor-hot (PROCHOT#) signal.

14. A method comprising:
detecting attachment of a device;
if the device is a current sink, then:
  triggering, by a power delivery (PD) circuit, a Soft PROCHOT# source mode;
  throttling, by a system-on-a-chip (SoC), a peak processor power level per settings in a register of the SoC; and
  if the device is detached, then restoring a maximum peak processor power level; and
otherwise:
  starting charging;
  setting a dynamic peak processor power level to an AC+DC setting; and
  if the device is not detached, then setting the peak processor power level to a DC-only setting.

15. The method of claim 14, further comprising:
when the device is a current sink, turning on a source load switch.

16. The method of claim 14, further comprising:
performing power-data objects (PDO) negotiation.

17. The method of claim 14, further comprising:
when the device is a current sink, adjusting the peak processor power level as needed.

18. The method of claim 14, wherein the method is implemented in a battery-operated system.

19. The method of claim 14, wherein the SoC comprises a secondary processor-hot circuit (PROCHOT2#).

20. The method of claim 14 further comprising:
inhibiting immediate assertion of a native hardware processor-hot (PROCHOT#) signal.

* * * * *